United States Patent

Phoenix

[19]

[11] Patent Number: 5,844,441
[45] Date of Patent: Dec. 1, 1998

[54] HIGH VOTAGE LATCH USING CMOS TRANSISTORS AND METHOD THEREFOR

[75] Inventor: Tim Phoenix, Gilbert, Ariz.

[73] Assignee: Microchip Technology, Incorporated, Chandler, Ariz.

[21] Appl. No.: 778,157

[22] Filed: Jan. 10, 1997

[51] Int. Cl.$^6$ .................................................. H03K 3/356
[52] U.S. Cl. ........................... 327/333; 327/208; 327/210
[58] Field of Search .................................... 327/200, 199, 327/203–210, 214, 215, 218, 333; 326/62, 63, 68, 80, 81, 82, 83

[56] References Cited

U.S. PATENT DOCUMENTS 4,532,436  7/1985  Bicmark .................................... 327/208

FOREIGN PATENT DOCUMENTS 58-162130  9/1983  Japan ...................................... 327/208
2-37823   2/1990  Japan ...................................... 327/333

Primary Examiner—Tuan T. Lam
Attorney, Agent, or Firm—Harry M. Weiss; Jeffrey D. Moy; Harry M. Weiss & Associates, P. C.

[57] ABSTRACT

A high voltage data latch with complementary outputs that are each set to one of two voltage levels ($V_{pp}$ and $V_b$). The high voltage data latch is designed using CMOS technology wherein no PMOS transistors have a voltage level greater than $V_{pp}/2$ volts across any node. This will allow PMOS transistors with lower voltage breakdown levels to be used. The high voltage data latch has two modes of operation. In a low voltage mode ($V_{pp}=V_{DD}$ and $V_b$=Ground) the outputs switch with respect to the inputs. In a high voltage mode ($V_{pp}>V_b>V_{dd}$) the outputs will be latched to the state they were in when the voltage rails changed states from the low voltage mode to the high voltage mode.

25 Claims, 1 Drawing Sheet

HIGH VOTAGE LATCH USING CMOS TRANSISTORS AND METHOD THEREFOR

BACKGROUND OF THE INVENTION

1. Field of the Invention

This invention relates generally to latches and, more specifically, to a high voltage data latch with complementary outputs that are each set to one of two voltage levels ($V_{pp}$ and $V_b$). The high voltage data latch is designed using CMOS technology wherein no PMOS transistors have a voltage level greater than $V_{pp}/2$ volts across any node. This will allow PMOS transistors with lower voltage breakdown levels to be used.

2. Description of the Prior Art

Currently, in integrated circuit systems, CMOS devices are the most commonly used technology. The voltage levels used to power the CMOS devices are dependent upon the particular geometry of the CMOS devices as well as variations in the fabrication process of the CMOS devices. Most CMOS devices can operate at voltage supply levels of five (5) volts or less. With a voltage supply level of five (5) volts, a CMOS device will typically generate an output signal between the range of ground and five (5) volts.

A problem arises since many systems using CMOS technology must drive or control devices requiring input signals having a voltage magnitude greater than five (5) volts. For example, LCD displays require input signals greater than five (5) volts in order to properly function. Furthermore, memory devices like Electrical Erasable Programmable Read Only Memory (EEPROM) devices require input signals as high as twenty (20) volts or more in order to program the EEPROM device. However, CMOS devices are limited to the amount of voltage they can handle. The high voltages across the CMOS devices when used to drive LCD displays or to program EEPROM devices can cause channel, dielectric, and/or junction breakdown within the CMOS devices.

Therefore, a need existed to provide an improve high voltage latch. The high voltage latch must use CMOS devices and be able to generate an output signal having a voltage level significantly greater than five (5) volts without suffering channel, dielectric, and/or junction breakdown within the CMOS devices. The high voltage latch must supply complimentary output signals that are each set to one of two voltage levels (i.e., $V_{pp}$ and $V_b$). The high voltage latch will have two modes of operation. In a low voltage mode ($V_{pp}=V_{DD}$ and $V_b$=Ground) the outputs switch with respect to the inputs. In a high voltage mode ($V_{pp}>V_b>V_{dd}$) the outputs will be latched in the state they were in when the voltage rails changed states from the low voltage mode to the high voltage mode. The high voltage data latch is designed using CMOS technology wherein no PMOS transistors will have a voltage level greater than $V_{pp}/2$ volts across any node. This will allow PMOS transistors with lower voltage breakdown levels to be used.

SUMMARY OF THE INVENTION

In accordance with one embodiment of the present invention, it is an object of this invention to provide an improved high voltage latch.

It is another object of the present invention to provide an improved high voltage latch that uses CMOS devices and is able to generate an output signal having a voltage level significantly greater than five (5) volts without suffering channel, dielectric, and/or junction breakdown within the CMOS devices.

It is another object of the present invention to provide an improved high voltage latch that supplies complimentary output signals that are each set to one of two voltage levels (i.e., $V_{pp}$ and $V_b$).

It is still another object of the present invention to provide an improved high voltage latch that has two modes of operation.

It is still another object of the present invention to provide an improved high voltage latch that has two modes of operation such that in a low voltage mode ($V_{pp}=V_{DD}$ and $V_b$=Ground) the outputs switch with respect to the inputs and in a high voltage mode ($V_{pp}>V_b>V_{dd}$) the outputs will be latched in the state they were in when the voltage rails changed states from the low voltage mode to the high voltage mode.

It is still another object of the present invention to provide an improved high voltage latch that is designed using CMOS technology wherein no PMOS transistors will have a voltage level greater than $V_{pp}/2$ volts across any node which will allow PMOS transistors with lower voltage breakdown levels to be used.

BRIEF DESCRIPTION OF THE PREFERRED EMBODIMENTS

In accordance with one embodiment of the present invention, a high voltage latch for operation at relatively high power supply voltages is disclosed. The latch has high voltage rail means for supplying an upper voltage level and low voltage rail means for supplying a lower voltage level. Latch means are coupled to the upper voltage rail and to the lower voltage rail for generating an output signal and a complementary output signal. The latch means has two modes of operation. In a low voltage mode, the output signal and the complementary output signal switch with respect to an input signal. In a high voltage mode, the output signal and the complementary output signal are latched in a state the output signal and the complementary output signal are currently under when the high voltage rail means and the low voltage rail means changes state from the low voltage mode to the high voltage mode. Input means are coupled to the latch means for sending an input signal and a complementary input signal to the latch means. Output terminal means are coupled to the latch means for outputting the output signal and the complementary output signal.

In accordance with another embodiment of the present invention, a method of providing a high voltage latch for operation at relatively high power supply voltages is disclosed. The method comprises the steps of: providing high voltage rail means for supplying an upper voltage level; providing low voltage rail means for supplying a lower voltage level; providing latch means coupled to the upper voltage rail and to the lower voltage rail for generating an output signal and a complementary output signal wherein the output signal and the complementary output signal switch with respect to an input signal when the high voltage rail means and the low voltage rail means operate in a low voltage mode and the output signal and the complementary output signal are latched in a state that the output signal and the complementary output signal are currently under when the high voltage rail means and the low voltage rail means changes state from the low voltage mode to a high voltage mode; providing input means coupled to the latch means for sending an input signal and a complementary input signal to the latch means; and providing output terminal means coupled to the latch means for outputting the output signal and the complementary output signal.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
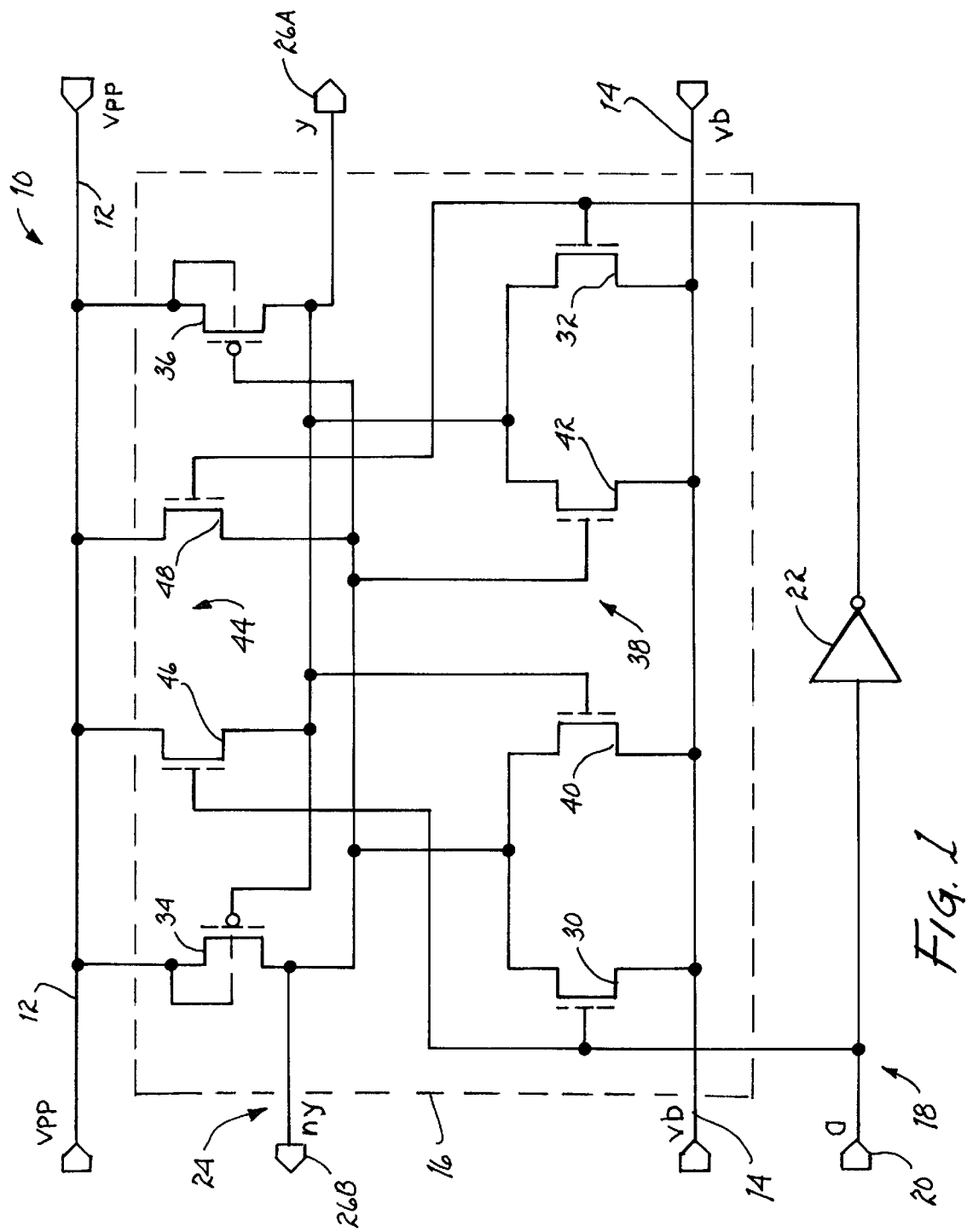
FIG. 1 is a simplified electrical schematic depicting the high voltage latch of the present invention.

Referring to FIG. 1, a system for generating high voltage level output signals (hereinafter system 10) using CMOS technology is shown. The system 10 has a high voltage rail 12 and a low voltage rail 14 for supplying power to the system 10. The high voltage rail 12 supplies a voltage $V_{pp}$ which can range anywhere from five (5) volts to twenty (20) volts or more. The low voltage rail supplies a voltage $V_b$. The system 10 has two modes of operation. In a low voltage mode, $V_b$ will be set to ground potential. In a high voltage mode, $V_b$ will be set to a voltage greater than ground potential bus less than the voltage $V_{pp}$. In the preferred embodiment of the present invention, in the high voltage mode, $V_b$ is set to a voltage approximately equal to $V_{pp}/2$.

A latching CMOS circuit 16 is coupled to the high voltage rail 12 and to the low voltage rail 14. The latching circuit 16 is used for generating an output signal and a complementary output signal. As stated above, the system 10 has two modes of operation. In the low voltage mode, the output signal and the complementary output signal switch with respect to an input signal. In a high voltage mode, the output signal and the complementary output signal are latched in a state that the output signal and the complementary output signal are currently under when the high voltage rail 12 and the low voltage rail 14 changes state from the low voltage mode to the high voltage mode.

An input circuit 18 is coupled to the latching CMOS circuit 16. The input circuit 18 is used for sending an input signal and a complementary input signal to the latching CMOS circuit 16. The input circuit 18 uses an input terminal 20 for receiving the input signal and for sending the input signal to the latching CMOS circuit 16. The input terminal 20 is coupled to an input of an inverter 22. The output of the inverter 22 is coupled to the latching CMOS circuit 16. The inverter 22 is used for generating a complementary input signal and for sending the complementary input signal to the latching CMOS circuit 16.

The system 10 also has an output circuit 24 coupled to the latching CMOS circuit 16. The output circuit 24 is used for outputting the output signal and the complementary output signal. The output circuit 24 is comprised of two output terminals 26A and 26B. The output terminal 26A is used for outputting the output signal, while the output terminal 26B is used for outputting the complementary output signal.

The latching CMOS circuit 16 is comprised of a plurality of CMOS transistors. A pair of n-channel CMOS transistors 30 and 32 are coupled to the input circuit 18. Both transistors 30 and 32 have gate, source, and drain terminals. The transistors 30 and 32 are connected to the system 10 in the following manner. The gate of the transistor 30 is coupled to the input terminal 20 for receiving the input signal. The source of transistor 30 is coupled to the low voltage rail 14. The gate of the transistor 32 is coupled to the output of the inverter 22 for receiving the complementary input signal, while the source of transistor 30 is coupled to the low voltage rail 14.

A first p-channel CMOS transistors 34 is coupled to the transistor 30. The p-channel transistor 34 has gate, source, drain, and bulk terminals. The gate terminal of the p-channel transistor 34 is directly coupled to the drain terminal of transistor 32. The source terminal of the p-channel transistor 34 is coupled to the output terminal 26B as well as to the drain terminal of the transistor 30. The drain terminal and the bulk terminal of the p-channel transistor 34 are coupled to the high voltage rail 12. A second P-channel CMOS transistor 36 is connected in a similar fashion. The gate terminal of p-channel transistor 36 is coupled to the drain terminal of the transistor 30. The source terminal of the p-channel transistor 36 is coupled to the output terminal 26A as well as to the drain terminal of the transistor 32. The drain terminal and the bulk terminal of the p-channel transistor 36 are coupled to the high voltage rail 12.

A holding circuit 38 is coupled to the output terminals 26A and 26B. The holding circuit 38 is used for holding the output signal and the complementary output signal of the latching CMOS circuit 16 in a present state until conditions change which will force the latching CMOS circuit 16 to change the output signal and complementary output signal (i.e., changes in the input signal and/or change in the mode of operation of the latching CMOS circuit 16). The holding circuit 38 is comprised of a pair of n-channel CMOS transistors 40 and 42. The transistor 40 has gate, drain and source terminals. The gate terminal of the transistor 40 is coupled to the gate terminal of the p-channel transistor 34. The drain terminal of the transistor 40 is coupled to the gate terminal of the p-channel transistor 36 and to the output terminal 26B. The source terminal of the transistor 40 is coupled to the low voltage rail 14. Likewise, the transistor 42 has gate, drain and source terminals. The gate terminal of the transistor 42 is coupled to the gate terminal of the p-channel transistor 36. The drain terminal of the transistor 42 is coupled to the gate terminal of the p-channel transistor 34 and to the output terminal 26A. The source terminal of the transistor 42 is coupled to the low voltage rail 14.

The latching CMOS circuit further includes a switching circuit 44. The switching circuit 44 is coupled to the input circuit 18. The switching circuit 44 allows the output signal and the complementary output signal to switch faster with respect to the input signal when the latching CMOS circuit 16 is operating under a low voltage mode. The switching circuit 44 is comprised of two n-channel CMOS transistors 46 and 48. The transistor 46 has gate, drain, and source terminals and is coupled to the system 10 in the following manner. The gate terminal of the transistor 46 is coupled to the input terminal 20, the drain terminal of the transistor 46 is coupled to the high voltage rail 12, and the source terminal of transistor 46 is coupled to the gate terminal of the transistor 40. Likewise, the transistor 48 has gate, drain and source terminals. The transistor 48 is coupled to the system 10 in the following manner. The gate terminal of the transistor 48 is coupled to the output of the inverter 22, the drain terminal of the transistor is coupled to the high voltage rail 12, and the source terminal of the transistor 48 is coupled to the gate terminal of the transistor 42.

OPERATION

The system 10 operates in the following manner. The latching CMOS circuit 16 has two modes of operation. In a low voltage mode ($V_{pp}=V_{DD}$ and $V_b$=Ground) the outputs switch with respect to the inputs. Thus, if a high input signal is sent to the input terminal 20, the transistor 30 will conduct as will transistor 46. With transistor 46 turned on, the voltage at the source terminal of transistor 46 will be sufficient to turn on the transistor 40. With both transistors 30 and 40 turned on, the voltage at the drain terminals of both transistors 30 and 40 will be pulled toward the voltage setting of the low voltage rail 14 (i.e., ground potential in the low voltage mode). The output terminal 26B will thus output a voltage signal having a magnitude approximately equal to that of the low voltage rail 14. Since the gate terminal of the p-channel transistor 36 is coupled to the drain terminals of the transistors 30 and 40, the p-channel transistor 36 will also conduct. The output terminal 26A will thus send out an output signal having a voltage magnitude approximately equal to that of the high voltage rail 12.

If the input signal at the input terminal 20 goes low, the inverter 22 will generate and send out a high input signal which will turn on the transistors 32 and 48. With transistor 48 turned on, the voltage at the source terminal of transistor 48 will be sufficient to turn on the transistor 42. With both transistors 32 and 42 turned on, the voltage at the drain terminals of both transistors 32 and 42 will be pulled toward the voltage setting of the low voltage rail 14 (i.e., ground potential in the low voltage mode). The output terminal 26A will thus output a voltage signal having a magnitude approximately equal to that of the low voltage rail 14. Since the gate terminal of the p-channel transistor 34 is coupled to the drain terminals of the transistors 32 and 42, the p-channel transistor 34 will also conduct. The output terminal 26B will thus send out an output signal having a voltage magnitude approximately equal to that of the high voltage rail 12.

As can be seen from the above description, in the low voltage mode ($V_{pp}=V_{DD}$ and $V_b$=Ground) the output terminals 26A and 26B switch with respect to the input signal. Furthermore, as can be seen from FIG. 1, the latch is designed using CMOS technology wherein neither of the p-channel transistors 34 nor 36 have a voltage level greater than $V_{pp}/2$ volts across any node. This allows PMOS transistors with lower voltage breakdown levels to be used in the construction of the system 10.

In a high voltage mode ($V_{pp}>V_b>V_{dd}$) the outputs will be latched in the state they were in when the voltage rails changed states from the low voltage mode to the high voltage mode. Thus, if the system 10 was operating under a low voltage mode with a high input signal, the output terminal 26A would output a voltage signal approximately equal in magnitude to the voltage level of the high voltage rail 12, while the output terminal 26B would output a voltage signal approximately equal in magnitude to the voltage level of the low voltage rail 14. If the system 10 changes to a high voltage mode such that the voltage of the low voltage rail 14 is greater than $V_{dd}$ but less than $V_{pp}$, the output of the output terminal 26A will be latched at a voltage approximately equal to that of the high voltage rail 12 and the output terminal 26B will be latched at a voltage approximately equal to that of the low voltage rail. Even if the input signal were to change, the change in the input signal would not be large enough to change the states of the output terminals 26A and 26B.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. A high voltage latch for operation at relatively high power supply voltages comprising, in combination:

high voltage rail means for supplying an upper voltage level;

low voltage rail means for supplying a lower voltage level wherein said lower voltage level is approximately ground when said high voltage latch operates in a low voltage mode and said lower voltage level is greater than ground and less than said upper voltage level when said high voltage latch operates in a high voltage mode;

latch means coupled to said high voltage rail means and to said low voltage rail means for generating an output signal and a complementary output signal wherein said output signal and said complementary output signal switch with respect to an input signal when said high voltage rail means and said low voltage rail means operate in said low voltage mode and said output signal and said complementary output signal are latched in a state that said output signal and said complementary output signal are currently at when said high voltage rail means and said low voltage rail means changes state from said low voltage mode to said high voltage mode;

input means coupled to said latch means for sending said input signal and a complementary input signal to said latch means; and output terminal means coupled to said latch means for outputting said output signal and said complementary output signal.

2. A high voltage latch in accordance with claim 1 wherein said input means comprises:

input terminal means coupled to said latch means for receiving said input signal and for sending said input signal to said latch means; and inverter means having an input coupled to said input terminal means and an output coupled to said latch means for generating said complementary input signal and for sending said complementary input signal to said latch means.

3. A high voltage latch in accordance with claim 2 wherein said latch means comprises:

a first transistor having a gate, drain and source terminal wherein said gate terminal of said first transistor is coupled to said input terminal means, said source terminal of said first transistor is coupled to said low voltage rail means, and said drain terminal of said first transistor is coupled to said output terminal means;

a second transistor having a gate, drain and source terminal wherein said gate terminal of said second transistor is coupled to said output of said inverter means, said source terminal of said second transistor is coupled to said low voltage rail means, and said drain terminal of said second transistor is coupled to said output terminal means;

a third transistor having a gate, drain and source terminal wherein said gate terminal of said third transistor is coupled to said drain terminal of said second transistor, said drain terminal of said third transistor is coupled to said high voltage rail means, and said source terminal of said third transistor is coupled to said output terminal means; and a fourth transistor having a gate, drain and source terminal wherein said gate terminal of said fourth transistor is coupled to said drain terminal of said first transistor, said drain terminal of said fourth transistor is coupled to said high voltage rail means, and said source terminal of said fourth transistor means is coupled to said output terminal means.

4. A high voltage latch in accordance with claim 3 wherein said first transistor and said second transistor are both n-channel transistors.

5. A high voltage latch in accordance with claim 3 wherein said third transistor and said fourth transistor are both p-channel transistors.

6. A high voltage latch in accordance with claim 3 wherein said latch means further comprises holding means coupled to said output terminal means for holding said output signal and said complementary output signal of said latch means in a present state.

7. A high voltage latch in accordance with claim 6 wherein said holding means comprises:
- a fifth transistor having a gate, drain and source terminal wherein said gate terminal of said fifth transistor is coupled to said gate terminal of said third transistor, said drain terminal of said fifth transistor is coupled to said gate terminal of said fourth transistor and to said output terminal means, and said source terminal of said fifth transistor is coupled to said low voltage rail means; and
- a sixth transistor having a gate, drain and source terminal wherein said gate terminal of said sixth transistor is coupled to said gate terminal of said fourth transistor, said drain terminal of said sixth transistor is coupled to said gate terminal of said third transistor and to said output terminal means, and said source terminal of said sixth transistor is coupled to said low voltage rail means.

8. A high voltage latch in accordance with claim 7 wherein said fifth transistor and said sixth transistor are both n-channel transistors.

9. A high voltage latch in accordance with claim 7 wherein said latch means further comprises switching means coupled to said input means for allowing said output signal and said complementary output signal to switch faster with respect to said input signal when said high voltage rail means and said low voltage rail means operate in said low voltage mode.

10. A high voltage latch in accordance with claim 9 wherein said switching means comprises:
- a seventh transistor having a gate, drain and source terminal wherein said gate terminal of said seventh transistor is coupled to said input terminal means, said drain terminal of said seventh transistor is coupled to said high voltage rail means, and said source terminal of said seventh transistor is coupled to said gate terminal of said fifth transistor; and
- an eighth transistor having a gate, drain and source terminal wherein said gate terminal of said eighth transistor is coupled to said output of said inverter means, said drain terminal of said eighth transistor is coupled to said high voltage rail means, and said source terminal of said eighth transistor is coupled to said gate terminal of said sixth transistor.

11. A high voltage latch in accordance with claim 10 wherein said seventh transistor and said eighth transistor are both n-channel transistors.

12. A method of providing a high voltage latch for operation at relatively high power supply voltages comprising the steps of:
- providing high voltage rail means for supplying an upper voltage level;
- providing low voltage rail means for supplying a lower voltage level wherein said lower voltage level is approximately ground when said high voltage latch operates in a low voltage mode and said lower voltage level is greater than ground and less than said upper voltage level when said high voltage latch operates in a high voltage mode;
- providing latch means coupled to said high voltage rail means and to said lower voltage rail means for generating an output signal and a complementary output signal wherein said output signal and said complementary output signal switch with respect to an input signal when said high voltage rail means and said low voltage rail means operate in said low voltage mode and said output signal and said complementary output signal are latched in a state that said output signal and said complementary output signal are currently at when said high voltage rail means and said low voltage rail means changes state from said low voltage mode to said high voltage mode;
- providing input means coupled to said latch means for sending said input signal and a complementary input signal to said latch means; and
- providing output terminal means coupled to said latch means for outputting said output signal and said complementary output signal.

13. The method of claim 12 wherein said step of providing input means further comprises the steps of:
- providing input terminal means coupled to said latch means for receiving said input signal and for sending said input signal to said latch means; and
- providing inverter means having an input coupled to said input terminal means and an output coupled to said latch means for generating said complementary input signal and for sending said complementary input signal to said latch means.

14. The method of claim 13 wherein said step of providing latch means further comprises the steps of:
- providing a first transistor having a gate, drain and source terminal wherein said gate terminal of said first transistor is coupled to said input terminal means, said source terminal of said first transistor is coupled to said low voltage rail means, and said drain terminal of said first transistor is coupled to said output terminal means;
- providing a second transistor having a gate, drain and source terminal wherein said gate terminal of said second transistor is coupled to said output of said inverter means, said source terminal of said second transistor is coupled to said low voltage rail means, and said drain terminal of said second transistor is coupled to said output terminal means;
- providing a third transistor having a gate, drain and source terminal wherein said gate terminal of said third transistor is coupled to said drain terminal of said second transistor, said drain terminal of said third transistor is coupled to said high voltage rail means, and said source terminal of said third transistor means is coupled to said output terminal means; and
- providing a fourth transistor having a gate, drain and source terminal wherein said gate terminal of said fourth transistor is coupled to said drain terminal of said first transistor, said drain terminal of said fourth transistor is coupled to said high voltage rail means, and said source terminal of said fourth transistor means is coupled to said output terminal means.

15. The method of claim 14 wherein said first transistor and said second transistor are both n-channel transistors.

16. The method of claim 14 wherein said third transistor and said fourth transistor are both p-channel transistors.

17. The method of claim 15 wherein said step of providing latch means further comprises the step of providing holding means coupled to said output terminal means for holding said output signal and said complementary output signal of said latch means in a present state.

18. The method of claim 17 wherein said step of providing holding means further comprises the steps of:

providing a fifth transistor having a gate, drain and source terminal wherein said gate terminal of said fifth transistor is coupled to said gate terminal of said third transistor, said drain terminal of said fifth transistor is coupled to said gate terminal of said fourth transistor and to said output terminal means, and said source terminal of said fifth transistor is coupled to said low voltage rail means; and providing a sixth transistor having a gate, drain and source terminal wherein said gate terminal of said sixth transistor is coupled to said gate terminal of said fourth transistor, said drain terminal of said sixth transistor is coupled to said gate terminal of said third transistor and to said output terminal means, and said source terminal of said sixth transistor is coupled to said low voltage rail means.

19. The method of claim 18 wherein said fifth transistor and said sixth transistor are both n-channel transistors.

20. The method of claim 18 wherein said step of providing latch means further comprises the step of providing switching means coupled to said input means for allowing said output signal and said complementary output signal to switch faster with respect to said input signal when said high voltage rail means and said low voltage rail means operate in said low voltage mode.

21. The method of claim 20 wherein said step of providing switching means further comprises the steps of:

providing a seventh transistor having a gate, drain and source terminal wherein said gate terminal of said seventh transistor is coupled to said input terminal means, said drain terminal of said seventh transistor is coupled to said high voltage rail means, and said source terminal of said seventh transistor is coupled to said gate terminal of said fifth transistor; and providing an eighth transistor having a gate, drain and source terminal wherein said gate terminal of said eighth transistor is coupled to said output of said inverter means, said drain terminal of said eighth transistor is coupled to said high voltage rail means, and said source terminal of said eighth transistor is coupled to said gate terminal of said sixth transistor.

22. The method of claim 21 wherein said seventh transistor and said eighth transistor are both n-channel transistors.

23. A high voltage latch for operation at relatively high power supply voltages-comprising, in combination:

high voltage rail means for supplying an upper voltage level;

low voltage rail means for supplying a lower voltage level wherein said lower voltage level is approximately ground when said high voltage latch operates in a low voltage mode and said lower voltage level is greater than ground and less than said upper voltage level when said high voltage latch operates in a high voltage mode;

latch means coupled to said high voltage rail means and to said low voltage rail means for generating an output signal and a complementary output signal wherein said output signal and said complementary output signal switch with respect to an input signal when said high voltage rail means and said low voltage rail means operate in said low voltage mode and said output signal and said complementary output signal are latched in a state that said output signal and said complementary output signal are currently at when said high voltage rail means and said low voltage rail means changes state from said low voltage mode to said high voltage mode;

an input means coupled to said latch means for sending said input signal and a complementary input signal to said latch means, said input means comprising:

an input terminal means coupled to said latch means for receiving said input signal and for sending said input signal to said latch means; and an inverter means having an input coupled to said input terminal means and an output coupled to said latch means for generating said complementary input signal and for sending said complementary input signal to said latch means; and an output terminal means coupled to said latch means for outputting said output signal and said complementary output signal;

said latch means comprising:

a first transistor having a gate, drain and source terminal wherein said gate terminal of said first transistor is coupled to said input terminal means, said source terminal of said first transistor is coupled to said low voltage rail means, and said drain terminal of said first transistor is coupled to said output terminal means;

a second transistor having a gate, drain and source terminal wherein said gate terminal of said second transistor is coupled to said output of said inverter means, said source terminal of said second transistor is coupled to said low voltage rail means, and said drain terminal of said second transistor is coupled to said output terminal means;

a third transistor having a gate, drain and source terminal wherein said gate terminal of said third transistor is coupled to said drain terminal of said second transistor, said drain terminal of said third transistor is coupled to said high voltage rail means, and said source terminal of said third transistor means is coupled to said output terminal means;

a fourth transistor having a gates drain and source terminal wherein said gate terminal of said fourth transistor is coupled to said drain terminal of said first transistor, said drain terminal of said fourth transistor is coupled to said high voltage rail means, and said source terminal of said fourth transistor means is coupled to said output terminal means;

holding means coupled to said output terminal means for holding said output signal and said complementary output signal of said latch means in a present state, said holding means comprising:

a fifth transistor having a gate, drain and source terminal wherein said gate terminal of said fifth transistor is coupled to said gate terminal of said third transistor, said drain terminal of said fifth transistor is coupled to said gate terminal of said fourth transistor and to said output terminal means, and said source terminal of said fifth transistor is coupled to said low voltage rail means; and a sixth transistor having a gate, drain and source terminal wherein said gate terminal of said sixth transistor is coupled to said gate terminal of said fourth transistor, said drain terminal of said sixth transistor is coupled to said gate terminal of said third transistor and to said output terminal means, and said source terminal of said sixth transistor is coupled to said low voltage rail means; and switching means coupled to input means for allowing said output signal and said complementary output signal to switch faster with respect to said input signal when said high voltage rail means and said low voltage rail means operate in said low voltage mode, said switching means comprising:

a seventh transistor having a gate, drain and source terminal wherein said gate terminal of said seventh transistor is coupled to said input terminal means, said drain terminal of said seventh transistor is coupled to said high voltage rail means, and said source terminal of said seventh transistor is coupled to said gate terminal of said fifth transistor; and an eighth transistor having a gate, drain and source terminal wherein said gate terminal of said eighth transistor is coupled to said output of said inverter means, said drain terminal of said eighth transistor is coupled to said high voltage rail means, and said source terminal of said eighth transistor is coupled to said gate terminal of said sixth transistor.

24. A high voltage latch in accordance with claim 23 wherein said first transistor, said second transistor, said fifth transistor, said sixth transistor, said seventh transistor, and said eighth transistor are all n-channel transistors.

25. A high voltage latch in accordance with claim 23 wherein said third transistor and said fourth transistors are both p-channel transistors.

* * * * *